(12) United States Patent
Gill

(10) Patent No.: US 7,317,367 B2
(45) Date of Patent: Jan. 8, 2008

(54) ELECTRICAL APPARATUS

(76) Inventor: Michael John Gill, Keeping House, Bucklers Hard, Beaulieu, Hampshire, SO42 7XA (GB)

( * ) Notice: Subject to any disclaimer, the term of this patent is extended or adjusted under 35 U.S.C. 154(b) by 217 days.

(21) Appl. No.: 10/490,858

(22) PCT Filed: Oct. 1, 2002

(86) PCT No.: PCT/GB02/04432

§ 371 (c)(1),
(2), (4) Date: Sep. 16, 2004

(87) PCT Pub. No.: WO03/030366

PCT Pub. Date: Apr. 10, 2003

(65) Prior Publication Data

US 2005/0011739 A1    Jan. 20, 2005

(30) Foreign Application Priority Data

Oct. 1, 2001  (GB) ............................... 0123521.7

(51) Int. Cl.
*H01H 51/22* (2006.01)
(52) U.S. Cl. .................................. 335/78; 200/181
(58) Field of Classification Search .............. 335/78; 200/181
See application file for complete search history.

(56) References Cited

U.S. PATENT DOCUMENTS

| | | | |
|---|---|---|---|
| 3,719,902 A | 3/1973 | Esterly | |
| 4,425,511 A | 1/1984 | Brosh | |
| 5,327,030 A | 7/1994 | DeVito et al. | |
| 6,124,650 A * | 9/2000 | Bishop et al. | 310/40 MM |
| 6,608,268 B1* | 8/2003 | Goldsmith | 200/181 |
| 2003/0107460 A1* | 6/2003 | Huang | 335/78 |
| 2004/0218341 A1* | 11/2004 | Martin et al. | 361/278 |

FOREIGN PATENT DOCUMENTS

WO   WO 00/25093   5/2000

\* cited by examiner

*Primary Examiner*—Lincoln Donovan
*Assistant Examiner*—Bernard Rojas
(74) *Attorney, Agent, or Firm*—Clark & Brody

(57) ABSTRACT

A micro-switch comprises at least one coil (22) of elongate electrically conductive material mounted on the support means (16). A movable actuator portion (20) of electrically conductive material is attached to the support means (16) so as to be movable against resilient means (10) of the micro-switch and so as to be adjacent to the coil (22). Pulse inductive circuitry (30, 32, 34, 36, 43a, 52, 54) is connected to the said at least one coil (22), and constructed to switch from one condition to another when the actuator portion (20) is moved against the force of the resilient means (10) beyond a predetermined threshold point as indicated by pulsoinductive monitoring effected by the pulse inductive circuitry (30, 32, 34, 36, 43a, 52, 54). As a result of this construction, there are no physical contacts which are brought into and out of contact with one another to effect the change in the electrical condition of the micro-switch.

23 Claims, 20 Drawing Sheets

ELECTRICAL APPARATUS

ELECTRICAL APPARATUS

A first aspect of the present invention relates to a micro-switch having a movable actuator portion secured to support means of the micro-switch via resilient means, the micro-switch being so constructed as to be switched from one electrical condition to another when the actuator portion is moved against the force of the resilient means beyond a predetermined threshold point.

Hitherto, such constructions of micro-switch have contacts which are brought into electrical contact with one another or which are taken out of electrical contact with one another depending upon the position of the actuator portion. This defines the changing condition of the micro-switch. Usually, the position of the actuator portion to cause a break between the contacts is different from that which causes the contacts to be electrically connected to one another. There is thus a hysteresis in the operation in such a previously proposed micro-switch.

A disadvantage of the foregoing construction of micro-switch is that, especially because of wear and tear in the contact parts, the micro-switch is unreliable and may change over a period of time as regards the positions of the actuator part which causes make and/or break of the contacts.

The present invention seeks to provide a remedy.

According to a first aspect of the present invention, a micro-switch comprises at least one coil of elongate electrically conductive material mounted on support means, a movable actuator portion of electrically conductive material attached to the support means so as to be movable against resilient means of the micro-switch and so as to be adjacent to the coil, and pulse inductive circuitry connected to the said at least one coil, and constructed to switch from one condition to another when the actuator portion is moved against the force of the resilient means beyond a predetermined threshold point as indicated by pulse inductive monitoring effected by the pulse inductive circuitry.

As a result of this construction, there are no physical contacts which are brought into and out of contact with one another to effect the change in the electrical condition of the micro-switch.

It will be appreciated in this context that pulse induction involves a measure of the voltage of other electrical parameter across the coil at a time after the effects of an energizing pulse on the coil would have substantially completely died away in the absence of the actuator portion.

Preferably, the pulse inductive circuitry is constructed to switch from the said another condition to the said one condition when the actuator portion is moved with the force of the resilient means beyond a predetermined threshold point as indicated by pulse inductive monitoring effected by the pulse inductive circuitry. This predetermined threshold point may be the same position as the predetermined threshold point at which the circuitry is changed from the said one condition to the said another condition when the actuator portion is moved against the force of the resilient means.

Preferably, the pulse inductive circuitry is so constructed to provide a measurement of the voltage or other electrical parameter across the coil at respective first and second instants of time after an energizing pulse.

Preferably, the pulse inductive circuitry is further constructed to check whether the actuator portion is moved beyond the threshold point referred to with the actuator portion being moved against the force of the resilient means, at the said first instant, and to check whether the actuator portion is moved beyond the threshold point referred to with the actuator portion moving with the force of the resilient means, at the said second instant. In this way, the hysteresis behavior of the aforementioned previously proposed micro-switch can be mimicked.

It is desirable for measurement cycles, each comprising an energizing pulse followed by a measurement, to be repeated continuously. The measurement may then comprise an average of successive measurements of respective successive measurement cycles.

The period between successive measurement cycles may be for a first, relatively long, time interval unless and until a movement of the actuated portion is indicated by at least one of the measurement cycles, whereupon the period between successive measurement cycles may be reduced.

As a check against the possibility that a stray signal has given a false measurement, a plurality of successive further values of a measurement for successive cycles may be checked by the circuitry to ascertain whether the first indication of movement was false or not. If it was, then the period between successive cycles may be immediately returned to the relatively long period. If it was not, the shorter period between measurement cycles may be maintained by the circuitry.

In a relatively simple construction of the micro-switch, the said resilient means comprises a relatively springy arm secured at one end of its ends to the support means and providing the actuating portion at its other end.

Advantageously, the actuator portion lies on the axis of the said at least one coil. A relatively strong signal is obtainable if the actuator portion is able to enter the coil interior.

Advantageously, the arm is substantially at right angles to the axis of the coil.

The micro-switch may be made in a relatively simple and inexpensive fashion if the whole of the arm including the actuator portion is made of the same electrically conductive material and the actuator portion is provided beyond a bend in the arm. Preferably, this bend effects a turn of the material of the arm of about 90□.

In a further development of this aspect of the invention, there is at least one further predetermined threshold point beyond which the actuator portion may be moved against the force of the resilient means to effect a switching of the pulse inductive circuitry to a further condition.

Provision may be made to remove the actuator portion to enable a measurement to be made after an energizing pulse has issued, resulting from the environment of the micro-switch as opposed to the position of the actuator portion, thereby to correct the threshold setting for the environment in which the micro-switch is placed.

Desirably, the period of each energizing pulse is substantially equal to the actuator time constant.

The circuitry may be so constructed as to take a further measurement at a third instant, to check that the coil and the circuitry and the associated components are present and working at a time when the actuator portion is fully withdrawn.

It is desirable for the circuitry to be further constructed to check that the voltage or other electrical parameter which is measured across the coil during a measurement cycle is substantially zero at a time when it would be expected that the signal has reached zero after an energizing pulse.

Diagnostic energizing pulses may be issued in addition to the measurement energizing pulses to confirm that the circuitry is present and correct.

A second aspect of the present invention relates to a position sensor comprising at least two coils of elongate electrically conductive material which are spaced apart from one another, or which diverge from one another in the sense that their respective axes are at an angle to one another and respective portions of the coils are substantially contiguous, the position sensor further comprising an actuator portion arranged to be moved within a region which is within or adjacent to the said at least two coils, and pulse inductive circuitry connected to said at least two coils to provide a signal which is dependent upon the position of the actuator portion relative to the coils.

One such device is discussed in WO-00/25093. A disadvantage of such a previously proposed position sensor is that it is relatively susceptible to changes in temperature and its circuit tolerances and tolerances as regards the positioning of the position sensor components are relatively low.

The present invention seeks to provide a remedy.

Accordingly, a second aspect of the present invention is directed to a position sensor comprising at least two coils of elongate electrically conductive material which are spaced apart from one another, or which diverge from one another in the sense that their respective axes are at an angle to one another and respective portions of the coils are substantially contiguous, the position sensor further comprising an actuator portion of electrically conductive material arranged to be moved within a region which is within or adjacent to the said at least two coils, and pulse inductive circuitry connected to the said at least two coils to provide respective signals having respective values, each indicative of the position of the actuator portion relative to the respective one of the said at least two coils, in which the pulse inductive circuitry is constructed to provide a signal having a value obtained substantially by dividing the difference between the said respective values by the sum of the said respective values.

An advantage of such a construction is that the value of the signal obtained is dimensionless.

It is desirable for measurement cycles, each comprising an energizing pulse followed by a measurement, to be repeated continuously. The measurement may then comprise an average of successive measurements of respective successive measurement cycles.

The period between successive measurement cycles may be for a first, relatively long, time interval unless and until a movement of the actuator portion is indicated by at least one of the measurement cycles, whereupon the period between successive measurement cycles may be reduced.

As a check against the possibility that a stray signal has given a false measurement, a plurality of successive further values of measurements for successive cycles may be checked by the circuitry to ascertain whether the first indication of movement was false or not. If it was, then the interval between successive cycles may be immediately returned to the relatively long period. If it was not, the shorter interval between measurement cycles may be maintained by the circuitry.

In one form of the position sensor, the two coils have their axes spaced apart and parallel to one another, and the actuator portion is generally U-shaped having respective ends adjacent respectively to the coils. Preferably, in this construction the ends lie on the respective axes of the coils.

Alternatively, the two coils may be spaced apart but have axes in common with one another, the actuator portion being movable along the axis between the coils.

Such a construction is particularly effective if the actuator portion comprises a sleeve of non-magnetically permeable electrically conductive material wound around a rod of magnetically permeable material.

In one valuable construction of position sensor, there are a multiplicity of coils, with a multiplicity of associated pulse inductive circuits, which are constructed to detect which of the two coils the actuator portion is for the time being closest to, and to effect the provision of a signal on the basis of the values of the signals from those respective coils.

For both aspects of the present invention, it is desirable for the creation of the energizing pulse to be effected by the switching of a field effect transistor of the circuitry.

The present invention extends to control apparatus incorporating a micro-switch or a position sensor embodying the present invention.

Examples of micro-switches and position sensors made in accordance with the present invention will now be described with reference to the accompanying drawings, in which.

Figure 1:
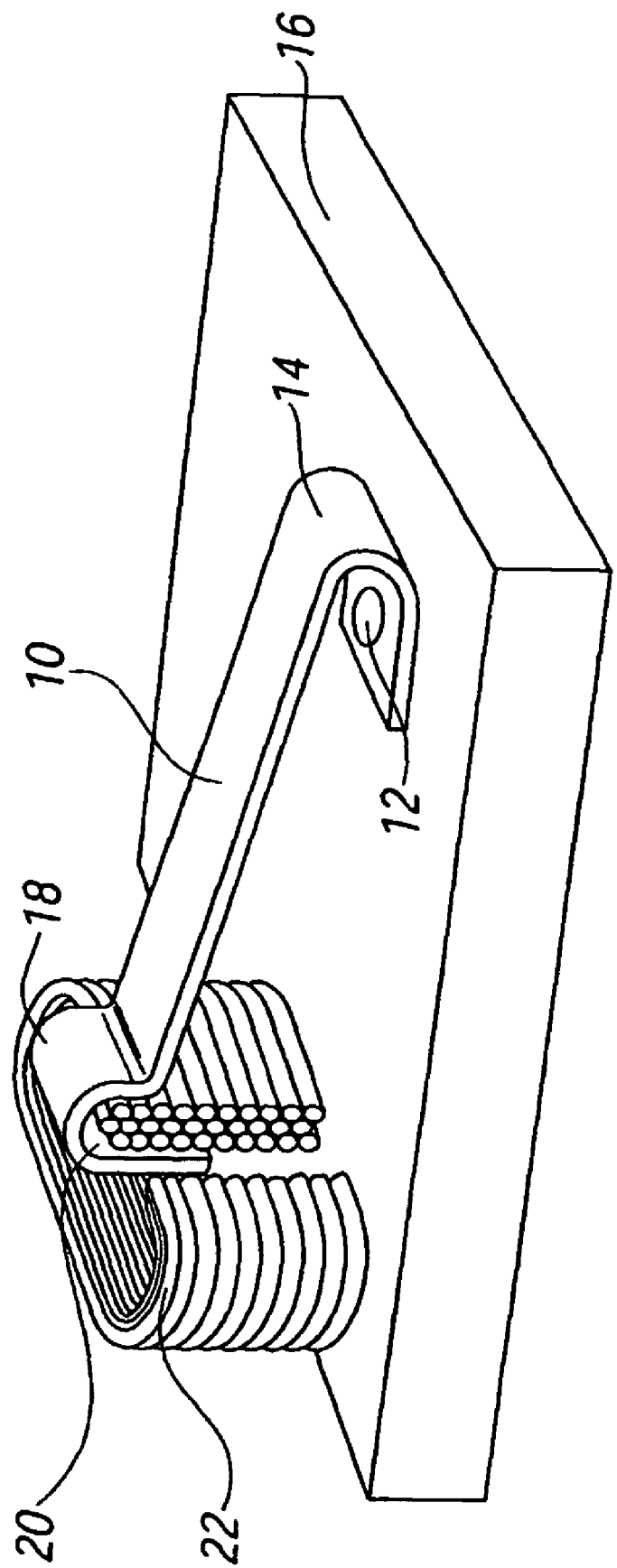
FIG. 1 is a diagrammatic perspective part cut-away representation of a micro-switch embodying the present invention.

The micro-switch shown in FIG. 1 comprises a steel arm 10 which is generally fixed by a screw 12 at one of its ends 14 to a base 16. The arm 10 is bent at its end 18 further from the screw 12, to provide an actuator portion 20 at that end 18 generally at right angles to the rest of the arm 10. A coil 22 is also mounted on the base 16 with its axis generally at right angles to that of the arm 10, the actuator portion 20 lying on the axis of the coil 22. The actuator portion 20 can be moved from its position illustrated in FIG. 1, against the resilience of the arm 10, along the axis of the coil 22, further into the interior thereof. A circuit such as is disclosed below may be incorporated into an element, such as base 16, illustrated in figure 1. further into the interior thereof.

Figure 2:
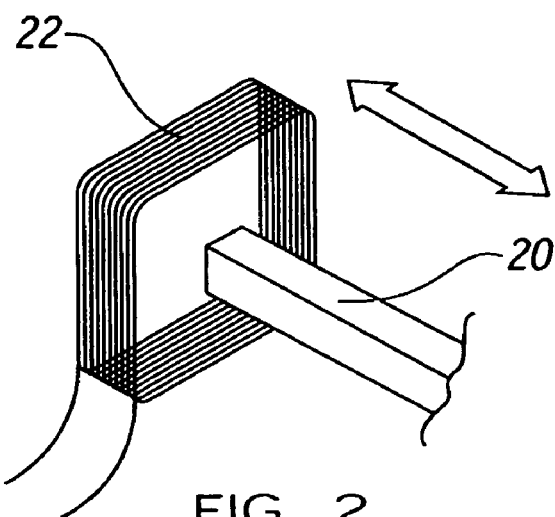
FIG. 2 is a simplified diagrammatic perspective view of parts of the micro-switch shown in FIG. 1.

A simplified view of parts of the micro-switch shown in FIG. 1 is shown in FIG. 2, comprising the actuator portion 20, and a single generally square interlaced coil 22 as parts of the micro-switch. The response of the apparatus is plotted on the vertical axis against linear axial position of the actuator portion 20 along the axis on the coil 22, in FIG. 3.

Figure 3:
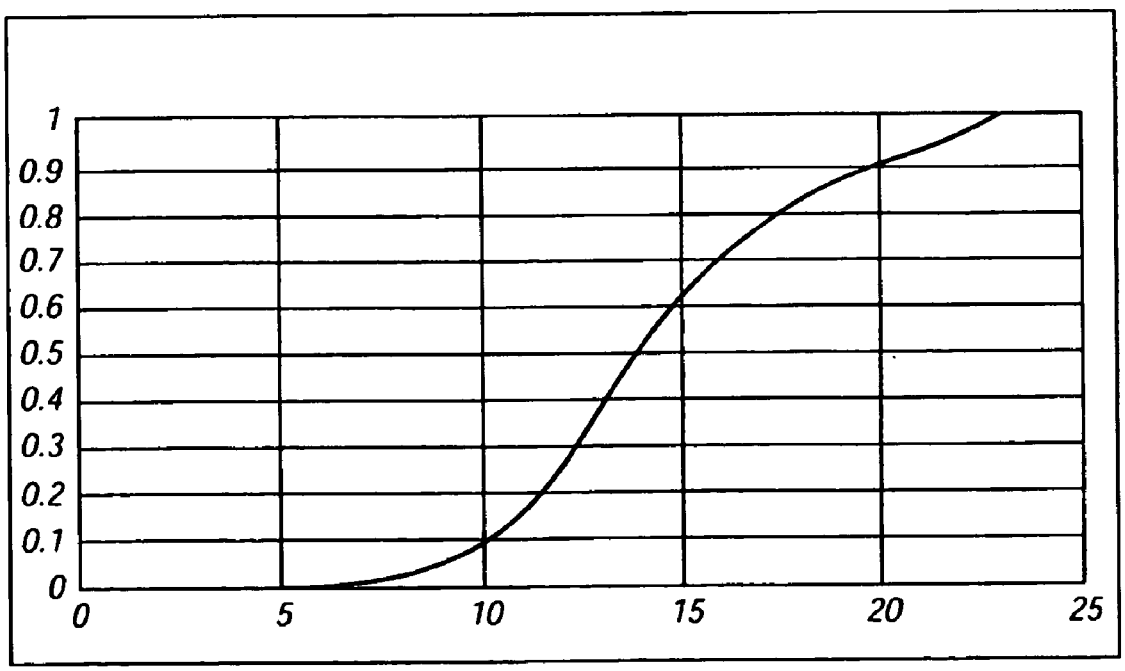
FIG. 3 is an explanatory graph.
Figure 4:
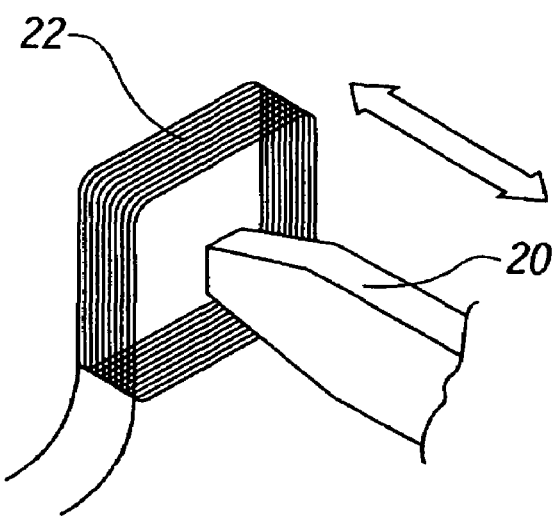
FIG. 4 is a diagrammatic perspective view of a modified micro-switch embodying the present invention.
Figure 5:
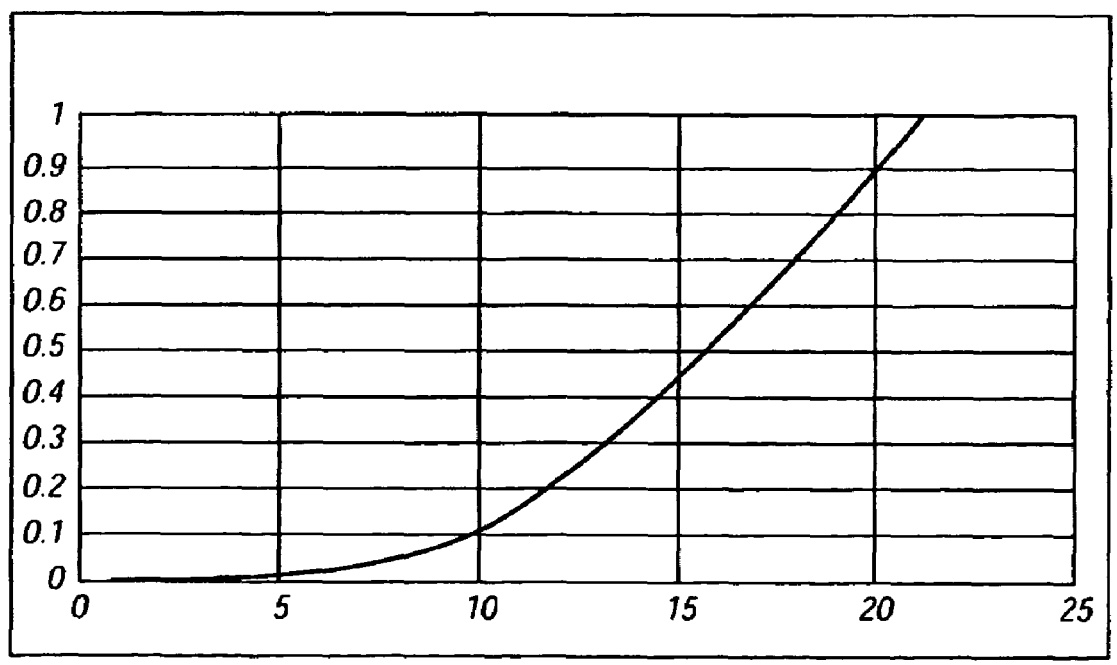
FIG. 5 is a further explanatory graph.

FIGS. 4 and 5 correspond respectively to FIGS. 2 and 3, but with a tapered actuator portion 20. The graph shows a higher degree of linearity for greater displacement.

Figure 6:
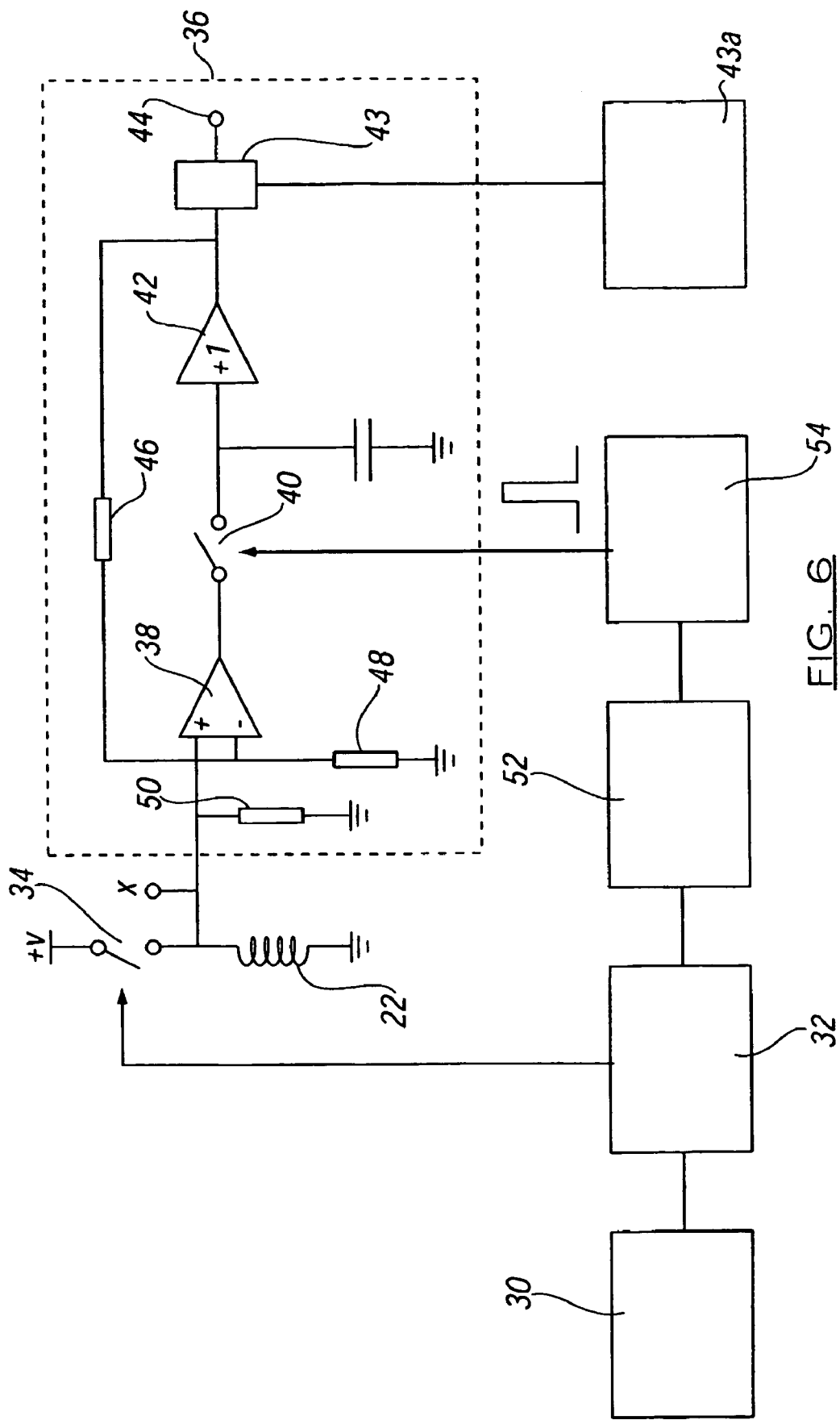
FIG. 6 shows a block circuit diagram of the electrical circuitry of either of the micro-switches shown in FIGS. 1 and 4.

The block circuit diagram shown in FIG. 6 shows circuitry used in conjunction with the coil 22. This comprises a system clock 30 connected to deliver clock pulses to a pulse generator 32. This delivers an 80 μsec switching pulse to a switch 34 so that, during that time, the switch is closed and the voltage of about 5 volts is connected to one end of the coil 22, the other being earthed. Also connected across the coil are voltage measuring means 36 comprising a differential amplifier 38, a switch 40 and buffer amplifier 42 connected in series with one another with an output signal 44 being taken from the output of the buffer amplifier 42, the positive input to the differential amplifier being connected to the non-earthed end of the coil 22 and the negative input of the differential amplifier being connected to a point between two series connected resistors 46 and 48 constituting a feedback from the buffer amplifier 42 and connected to earth. The positive connection to the differential amplifier 38 is also connected to earth by a resistor 50.

A time delay 52 is also connected to the pulse generator 32, and a pulse generator 54 generating a pulse of approximately 3 μsec is connected to receive a signal from a delay 52 and cause the switch 40 to be closed for that pulse period.

The system clock 30 causes the pulse generator 32 to close the switch 34 for a period of approximately 80 μsec.

Figure 7:
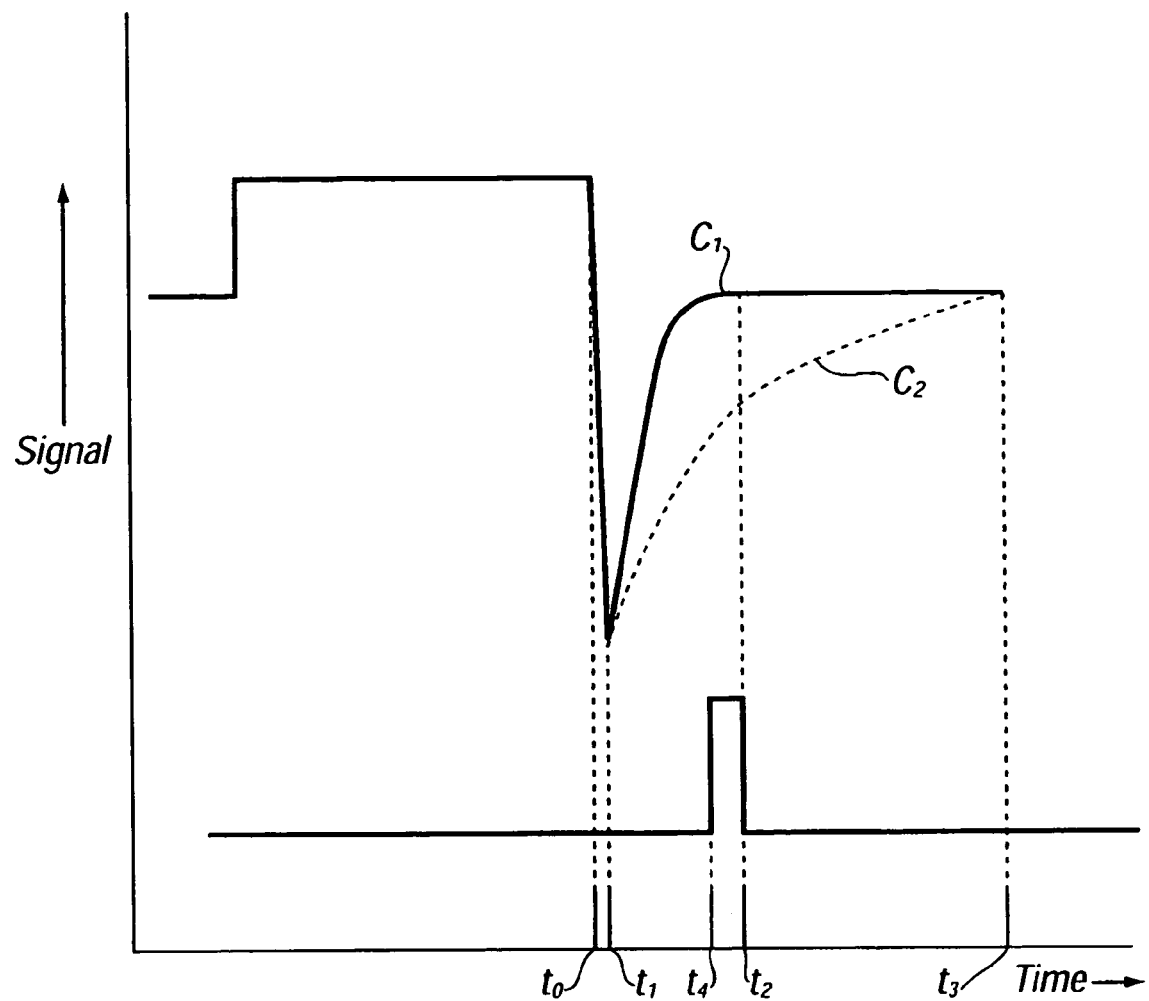
FIG. 7 shows a further explanatory graph.

This energizes the coil 22 for that period such that the voltage across the coil has a step function as shown in the graph in FIG. 7. When this pulse ends at time t0 in FIG. 7, the self-inductance of the coil 22 causes the voltage across it to fall sharply to a negative value of a magnitude well in excess of the 5 volts it had initially, whereafter at time t1 it starts to rise again and to reach zero value at about time t2 following an exponential curve C1 between time t1 and t2. However, with the presence of the electrically-conductive portion 20, it follows the broken curve C2, in which the decay of a negative voltage across the coil 22 is still exponential (shown very diagrammatically in FIG. 7), but is slowed down so that the voltage does not come to zero value again until about time t3, well after time t2.

The actual measure of this decay influence is measured by that part of the circuitry shown in the box 36 of FIG. 6. Thus, the switch 40 receives the pulse which closes it for about 3 μsec, about 10 μsec after the coil 22 was de-energized (by which time the excitation energy has completely died away). This therefore provides a measure of the voltage across the coil 22 at time t4, about 20 μsec after time t0 and lasting for about a period of 3 μsec. Thus, the measure of the decay influence at time t4 occurs at a time when the voltage across the coil 22 would have been substantially zero had the actuator portion 20 been absent. In the Figure, this voltage is very nearly zero, which is sufficient. Provided more time is available, it would be preferable to position t4 where that voltage is zero (although in reality the voltage never is exactly zero).

The signal from the buffer 42 is received by a first input of a comparator 43, the other input of which is connected to receive a value from a comparator reference 43a. The latter provides a predetermined threshold value. If the signal at the first input of the comparator 43 exceeds that threshold value, then the output signal at the output 44 changes from a low value to a high value, or vice versa.

Figure 8:
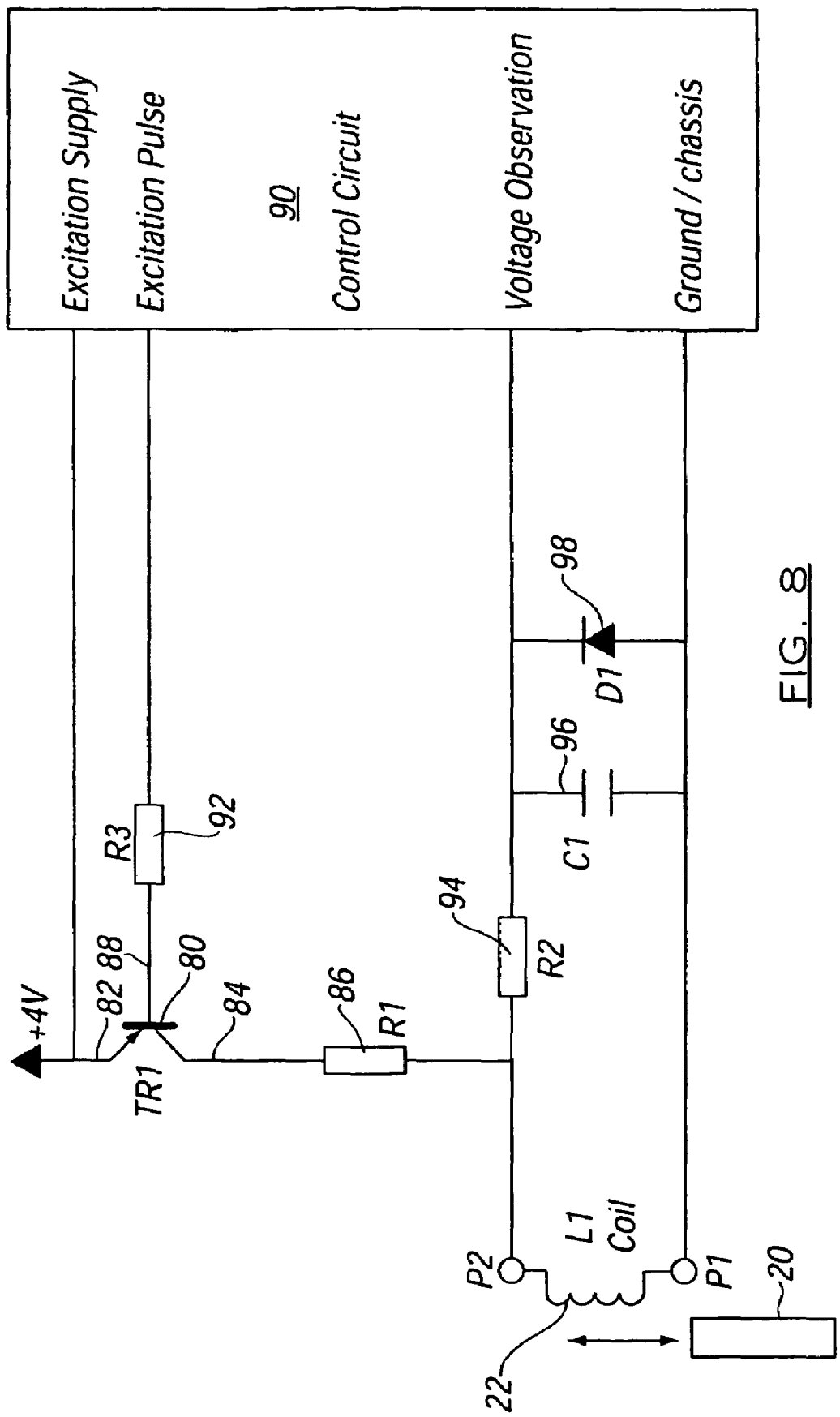
FIG. 8 shows a modified form of the circuitry of either one of the micro-switches shown in FIGS. 1 and 4.

FIG. 8 shows simplified circuitry for the micro-switch of FIG. 1. The energizing pulse is delivered to the coil 22 via a switching field effect transistor (FET) 80 having an input terminal 82 connected to a 4 volt voltage supply and an output terminal 84 connected to one end of the coil 22 via a resistor 86. The switching terminal 88 of the FET 80 is connected to pulse generator with a control circuit 90 via a resistor 92. A further resistor 94 and a capacitor 96 are connected in series across the coil 22. The other end of the coil 22 is connected to ground, and a diode 98 may be connected in parallel across the capacitor 96 for conduction towards the FET 80. The control circuit 90 is connected to observe the voltage across the capacitor 96.

Figure 9A:
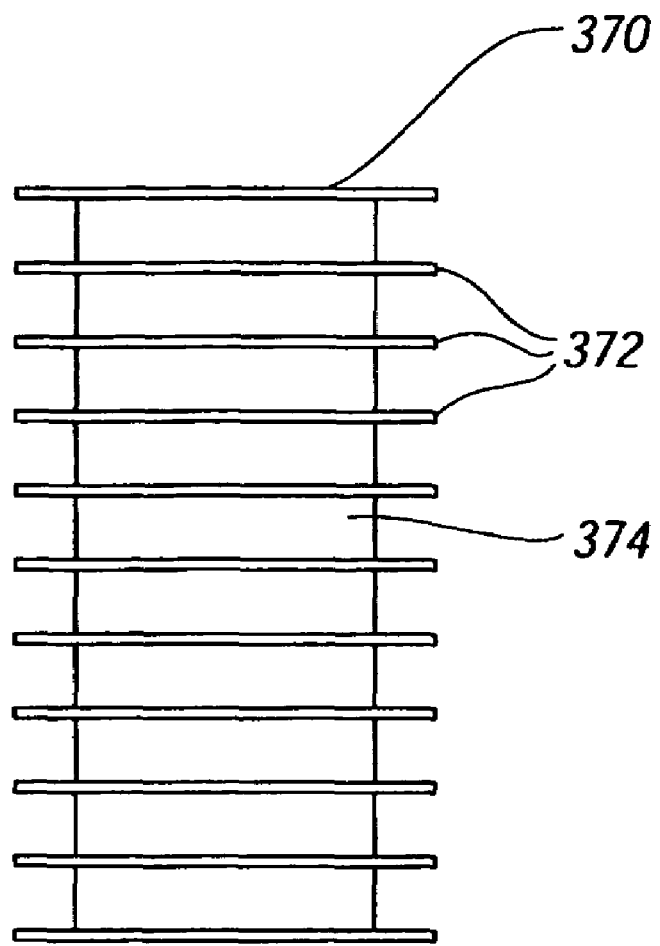
FIGS. 9a and 9b show side and end views respectively of an alternative construction of a part of either one of the micro-switches shown in FIGS. 1 and 4.
Figure 9B:
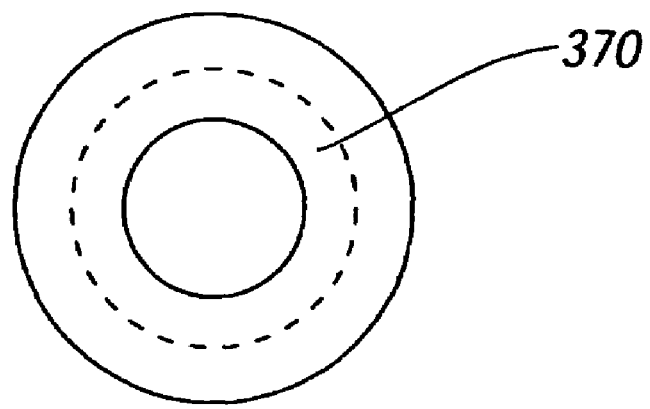

In the modification of the micro-switch shown in FIGS. 9a and 9b, the coil 22 is provided by a hollow cylinder 370, with spacers 372 and a single elongate coil 374 wound around the cylinder 370 with suitable slots (not shown) being formed in the spacers 372 to enable the winding to be continuous along the length of the cylinder 370. In this case, the movable electrically-conductive portion 20 (not shown in FIGS. 9a and 9b) would extend into the interior of the cylinder 370, without touching it, and would move in its longitudinal direction.

FIGS. 10a to 10e show parts of a position sensor 214 and their relative position in relation to an electrically-conductive actuator portion 200. The sensor 214 shown in these Figures comprises a hollow box 216 of nylon or other electrically non-conductive plastics material, molded into the shape of an open bottomed box. The box is generally elongate. A first transverse slot 222 is machined across the outside of the top of the box. In each side of the box, on the outside thereof, are machined two slanting slots 224 which extend downwardly from one end of the slot 222 to respective corners of the box, with the angle between the two slots 224 being approximately 100°. Lastly, there are two end slots 226 machined across the bottoms of the end walls of the box 220.

Two coils 228 of copper filament or other electrically-conductive wire are wound around the box, each winding being generally rectangular with one side of the rectangle seated in the slot 222, the opposite side of one of the coils being in one of the slots 226 and the opposite side of the other coil being in the other slot 226 with the other sides of the two coils seated in the slanting slots 224. Thus, the two coils 228 diverge from one another, from their sides which are contiguous and which are both seated in the slot 222, with an angle of about 100° between them.

Figure 10D:
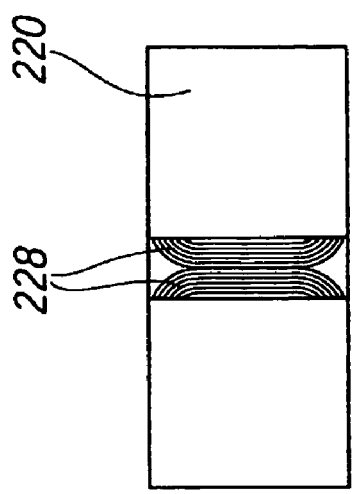
FIGS. 10a to 10e show, respectively, side, bottom, end, top and perspective views of part of a position sensor embodying the present invention.
Figure 10A:
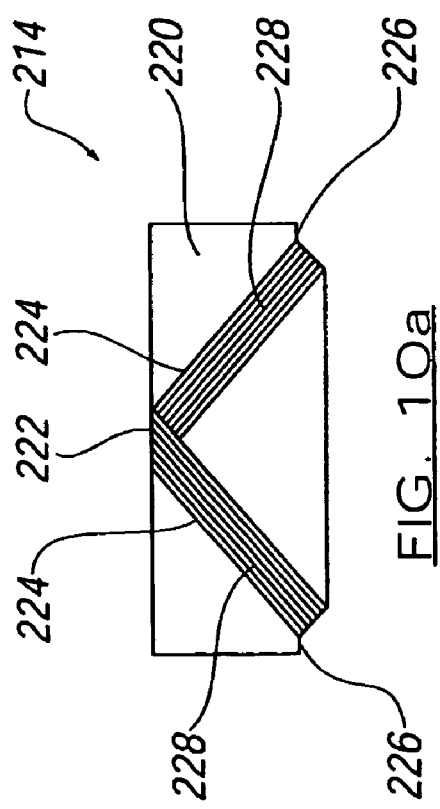
Figure 10B:
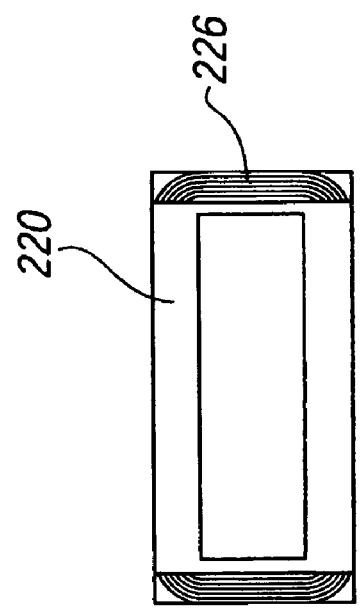
Figure 10C:
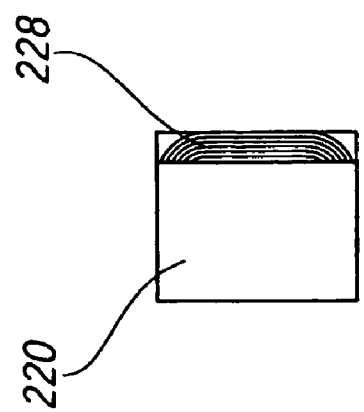
Figure 10E:
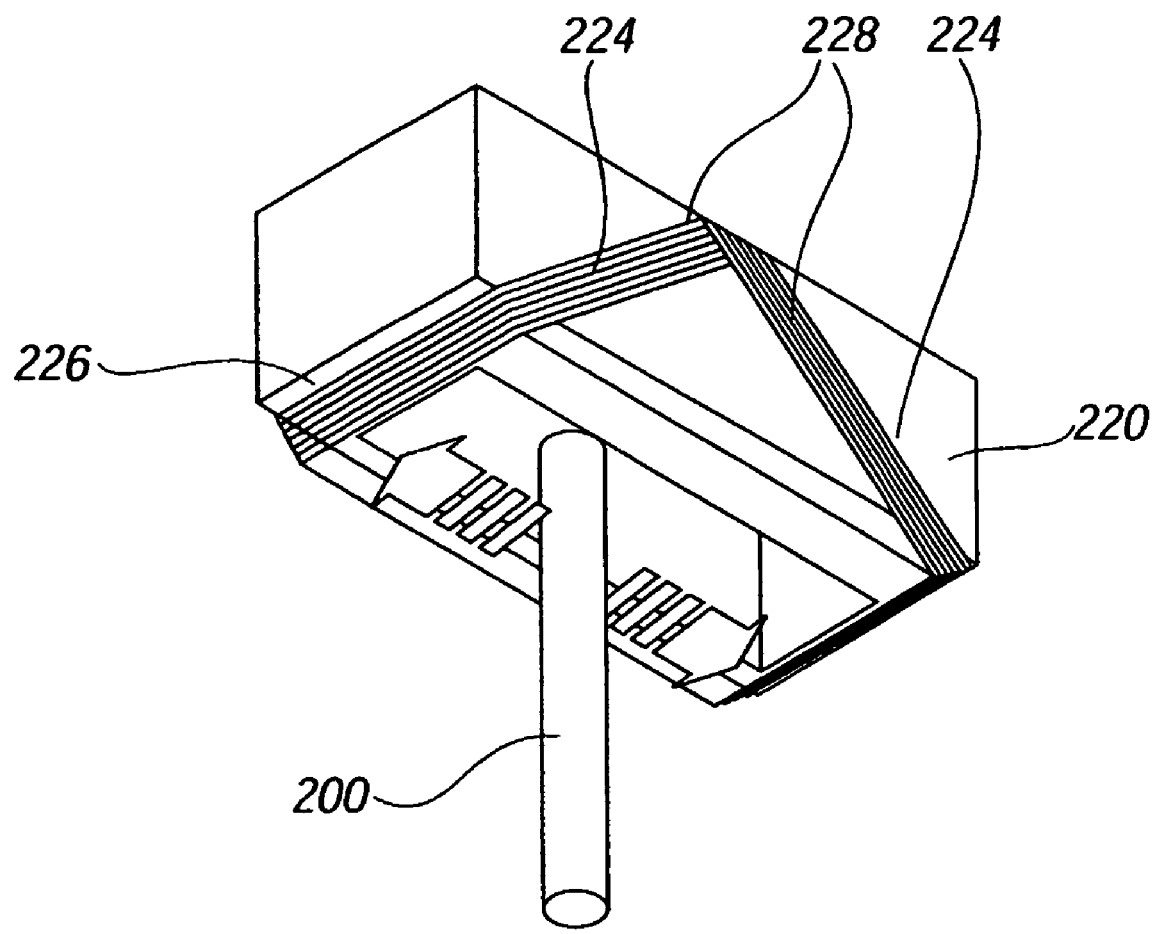

As can be seen from FIG. 10e, the electrically-conductive portion 200 has an upper end received within the interior of the box 220 without touching any part of that box, this end being within a volume defined by the coils 228. The coils surround that volume, and the volume extends between the coils.

Figure 11:
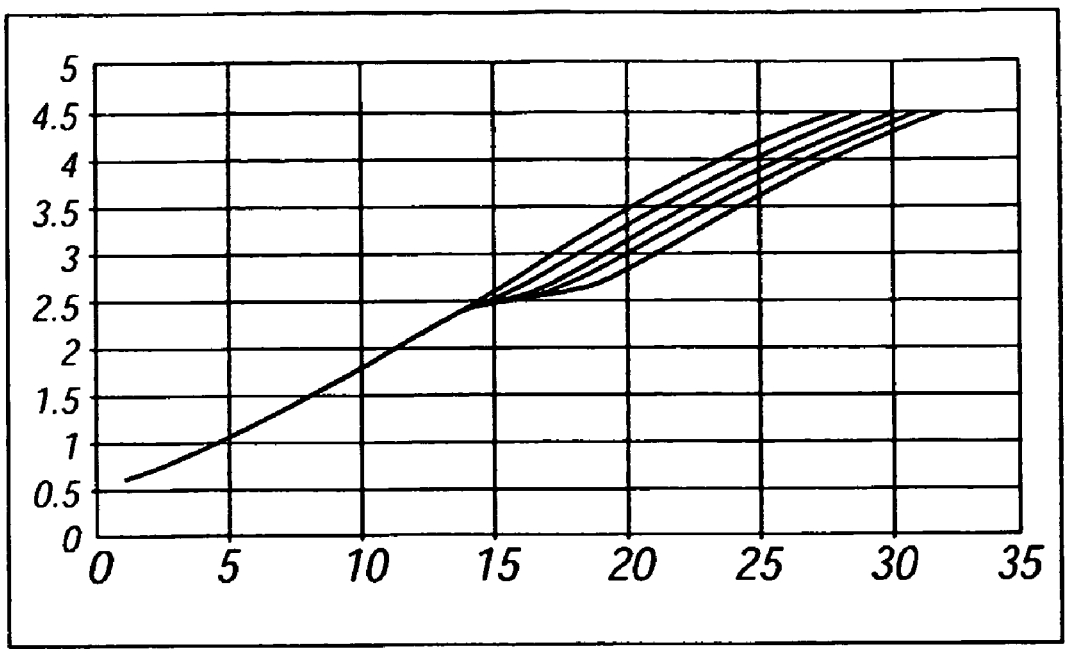
FIGS. 11 and 12 show further explanatory graphs.
Figure 12:
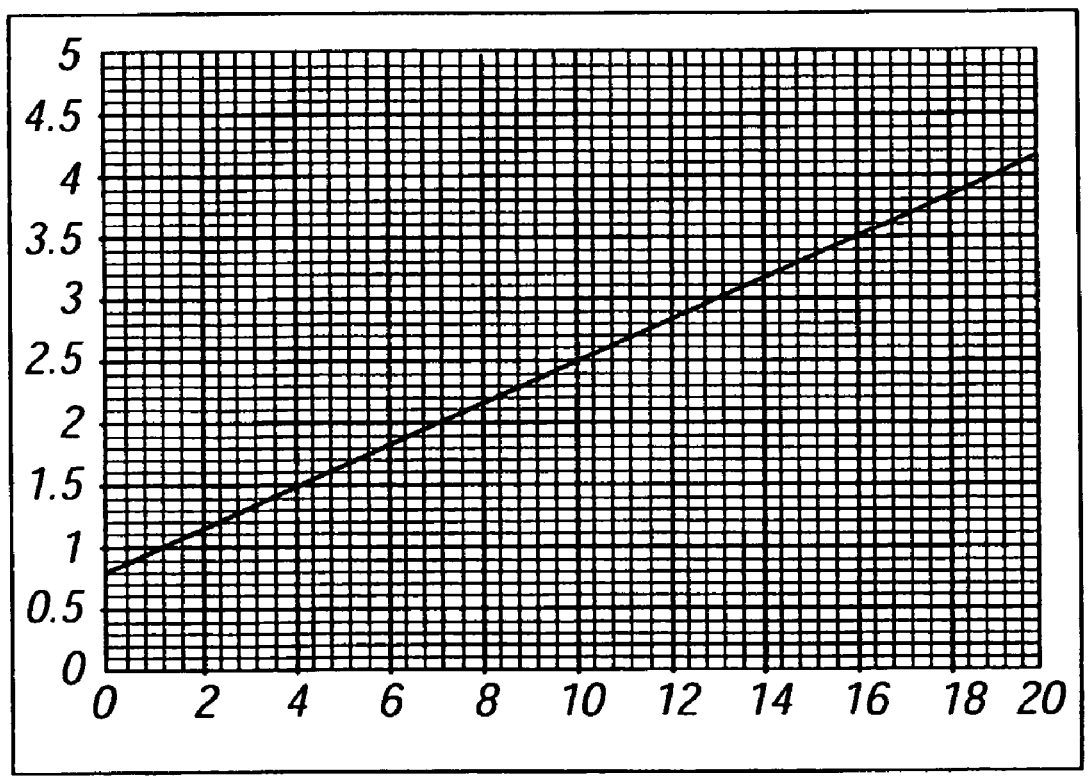

FIG. 11 shows output plotted against actuator position when the latter is composite, providing two actuator portions which are physically fixed in position relative to one another and which are provided with respective different coil portions the outputs from which are subtracted. The different curves show different relative positions of the two actuator portions, one of which can be seen to provide a substantially linear output for the full movement range. This is also shown in FIG. 12, where the composite actuator is secured to an accelerator foot pedal, and the output in volts is shown as a function of rotation of the pedal in degrees.

The modification to the position sensor shown in FIGS. 13a to 13e, comprises an increase in the width of the box 220, and the provision of two pairs of coils, each pair being wound in substantially the same fashion as in the two coils of the position sensor part shown in FIGS. 10a to 10e, and each pair being orthogonally arranged to the other pair. The reference numerals used in FIGS. 13a to 13e correspond to those used in FIGS. 10a to 10e. It will be appreciated that with such a construction, the position of the electrically-conductive portion 200 can be determined with respect to two degrees of freedom, so that it is possible to determine the position of the electrically-conductive portion 200 both along the length of the box 220 and also across its width. One such application for such a position sensor is to determine both the relative position along two orthogonal axes of a joystick, the outputs from the position sensor being used to position a tool and/or a machine tool table in both of two orthogonal axes, or to vary the speed of movement of the tool and/or machine tool table in these directions. In another such application, such a joystick provided with such a position sensor could be used to control a radio-controlled vehicle or toy.

Numerous variations and modifications to the illustrated embodiments may occur to the reader without taking the result outside the scope of the present invention. For example, the box 20 with the coils 28 may be enclosed in an aluminium or copper casing to minimize the effect of external fields whilst still enabling useful measurements to be made.

Figure 13D:
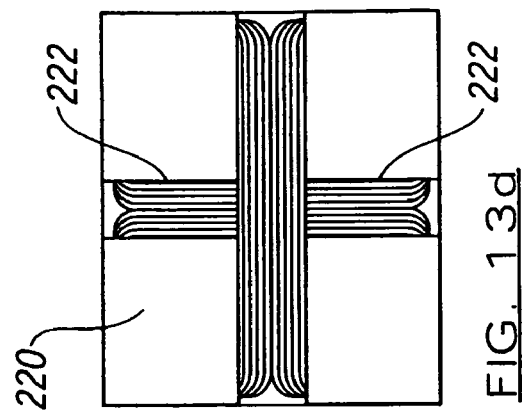
FIGS. 13a to 13f show possible modifications to the part shown in FIG. 10a to 10e, Figures of the same letter being of corresponding view.
Figure 13A:
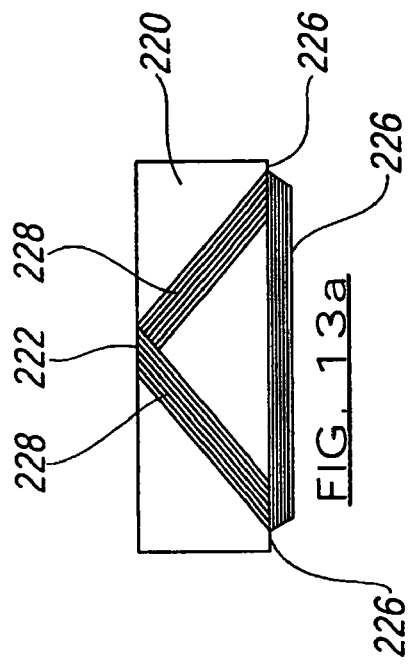
Figure 13B:
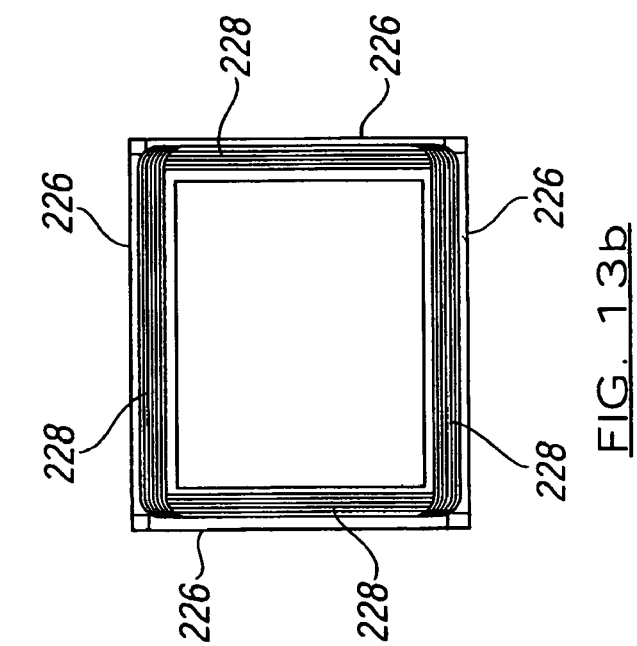
Figure 13C:
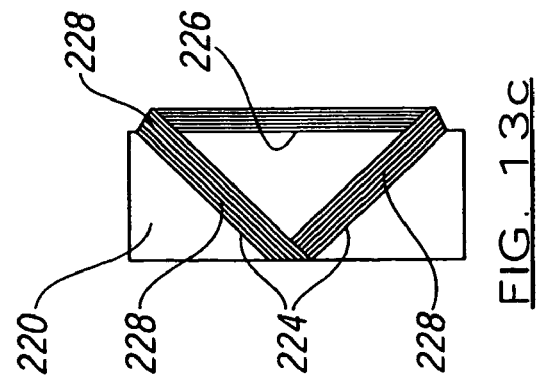
Figure 13E:
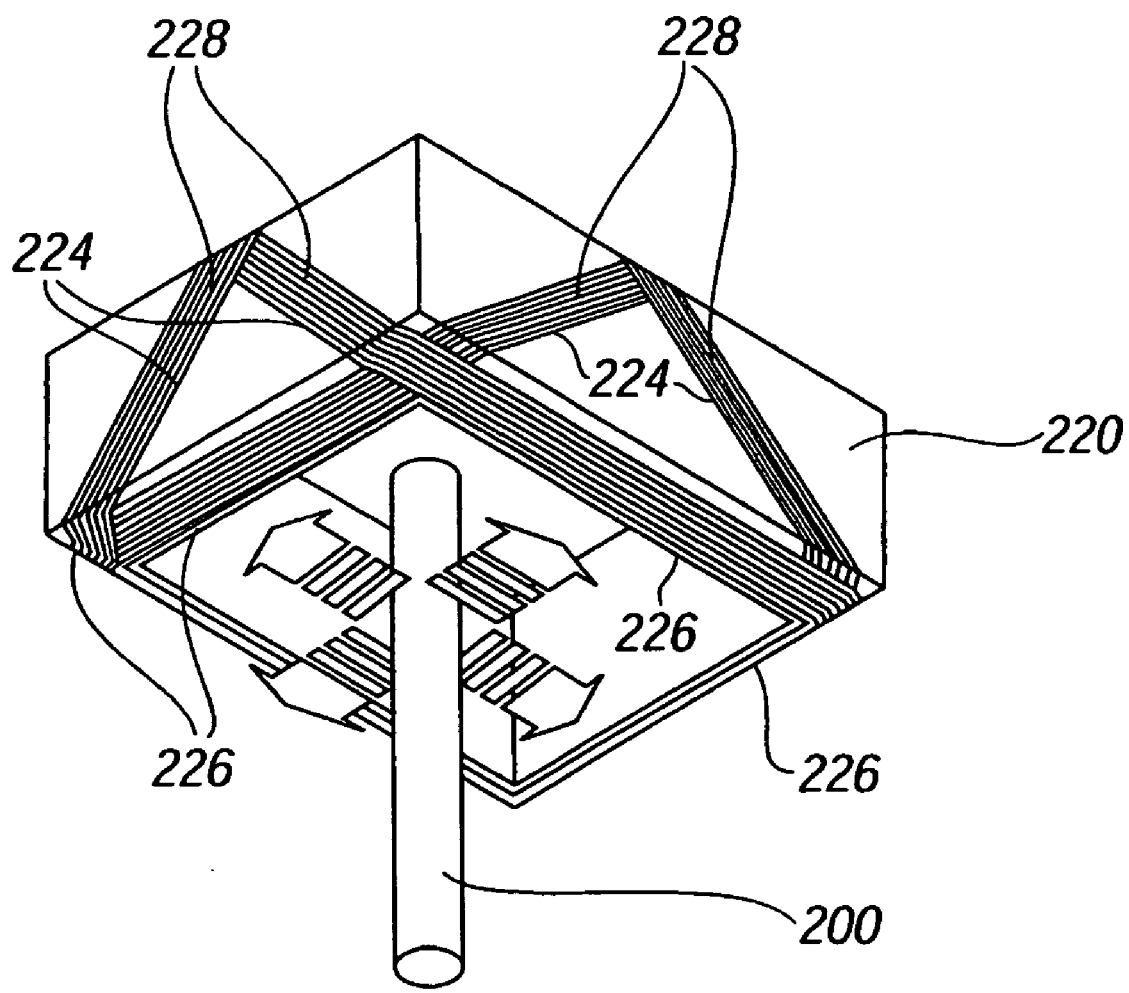
Figure 13F:
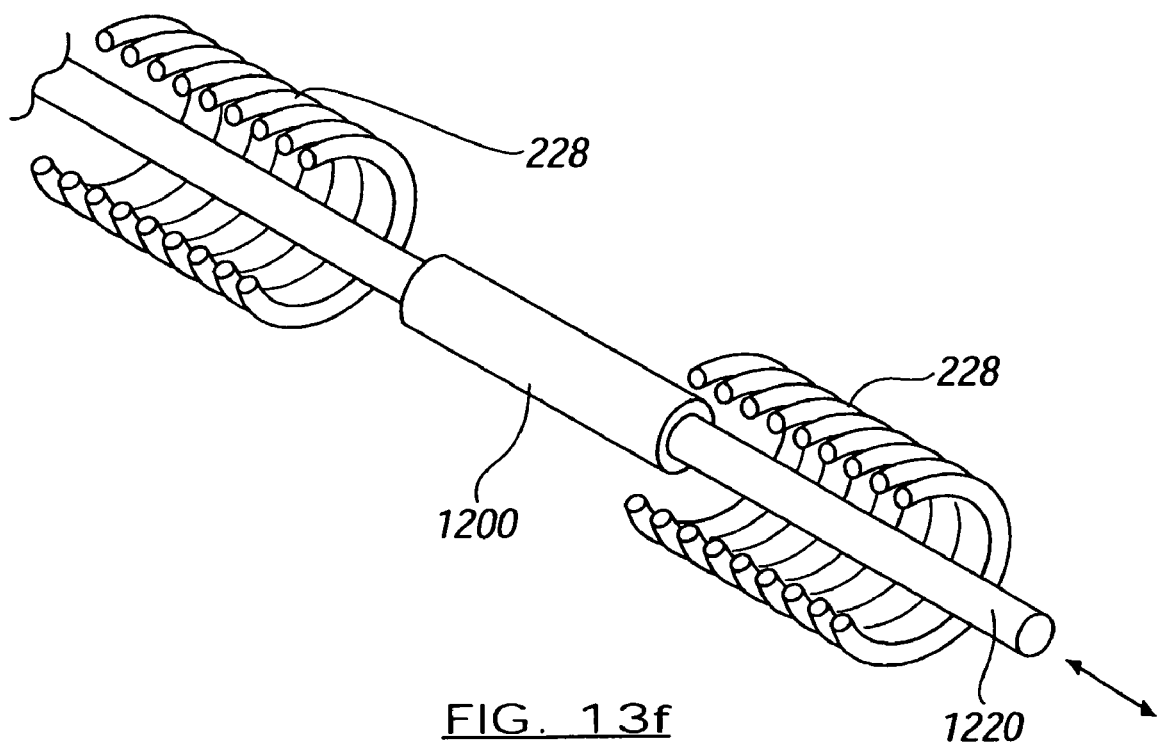

The modification shown in FIG. 13f comprises the coils 228 spaced apart from one another but sharing a common axis, the actuator portion 200 comprising a non-magnetically permeable electrically conductive sleeve 1200 surrounding a magnetically permeable rod 1220.

Figure 14:
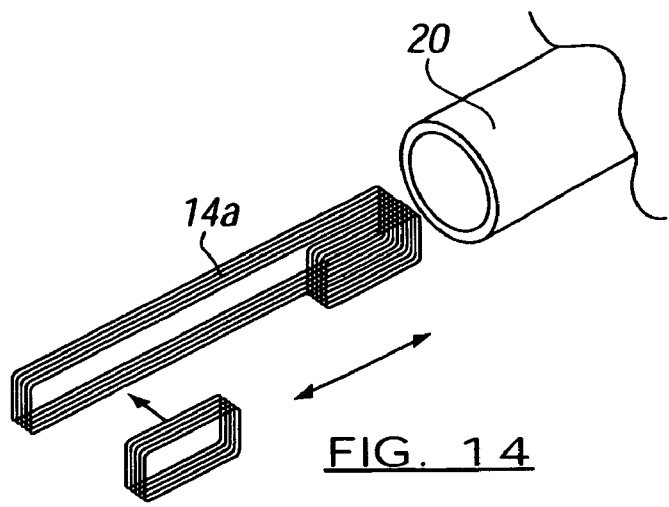
FIG. 14 shows a perspective view of a further modified position sensor embodying the present invention.
Figure 14A:
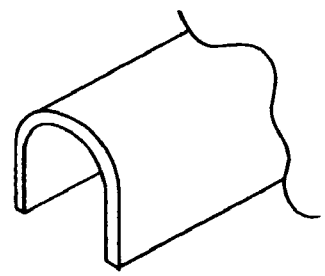
FIG. 14a shows a perspective view of a modified part of the position sensor shown in FIG. 14.

The modified apparatus shown in FIG. 14 has coiled portions 14a, a main one of which is elongate transversely of its winding axis and two end coil portions overlapping the ends of the main elongate coiled portion, the latter being movable into and out of a tubular actuator portion 20. The latter may be modified so that it has an inverted U-shape as shown in FIG. 14a.

Figure 15:
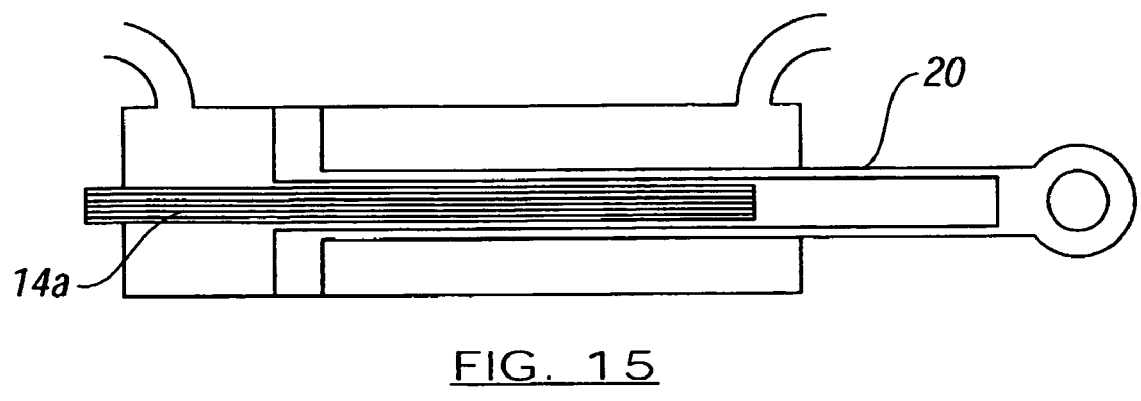
FIGS. 15 and 18 show respective further embodiments of the present invention in diagrammatic form.

In the modified apparatus of FIG. 15, the coil 14a is also elongate and the actuator portion 20 is tubular, being a hollow piston rod of a piston and cylinder arrangement, so that the apparatus of which the coil and actuator portions are parts determines the position of the piston rod of this arrangement.

Figure 16:
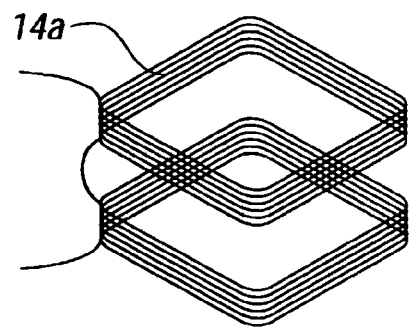
FIG. 16 shows a perspective view of parts of a further position sensor made in accordance with the present invention.

FIG. 16 shows a possible construction for the coil 14a as two coil portions spaced apart, having a common winding axis, and being electrically connected in series with one another. These coils allow for a short overall construction.

Figure 17:
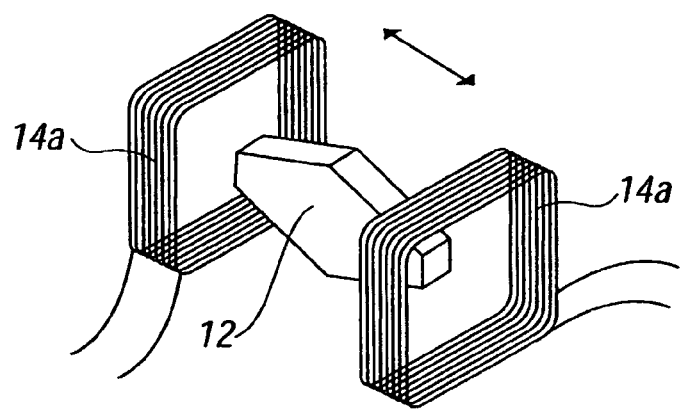
FIGS. 17 and 19 to 21 show respective further perspective views of respective further position sensors made in accordance with the present invention.
Figure 18:
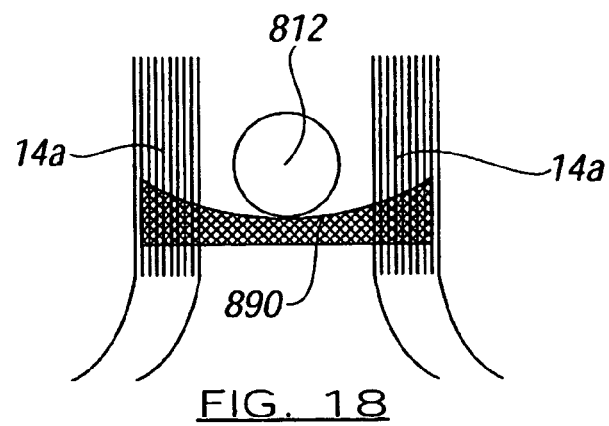

FIG. 17 shows a construction having two coils 14a which are spaced apart, having a common winding axis, but being connected separately to a position sensor (not shown in FIG. 17), so as to provide signals which are subtracted from one another to give a substantially linear response, that being further enhanced by the actuator portion 20, which is composite and which has two tapered ends each movable into and out of the volumes surrounded respectively by the coil portions.

In the apparatus of which a part is shown in FIG. 118, the coils 14a are arranged as shown in FIG. 17, but the actuator portion comprises a steel ball 812, which is free to roll on a part spherical dish 890, so that the apparatus is able to measure tilt, and could comprise a tilt switch. This arrangement may be enclosed and within oil for lubrication and damping.

Figure 19:
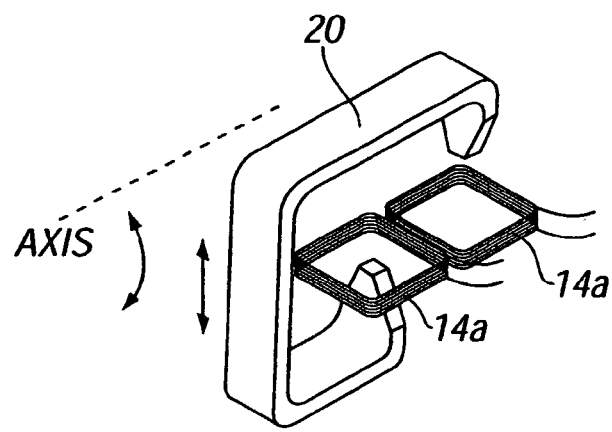

In the arrangement of FIG. 19, the coils 14a are placed alongside one another with the respective axes of winding parallel with one another, and the actuator portion 20 is again composite, comprising a yoke with a tapered end on the axis of one of the coils 14a and another tapered end on the axis of the other of the coils 14a, the yoke being arranged to be movable linearly along a direction parallel to the coil axes, the ends of the actuator portion 20 extending in opposite directions so that as one end approaches its coil 14a, the other leaves its coil 14a whilst travelling in the same direction, and vice versa. The same effect is obtainable with a motion of the yoke about an axis which is displaced from the coils and which is parallel to a line passing through the centers of the coils 14a.

Figure 20:
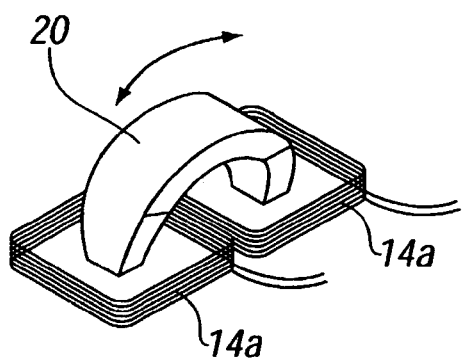

In the modification shown in FIG. 20, the yoke is generally semi-circular, with its ends generally at the respective centers of the coils 14a, possible movement of the yoke being a rocking motion about the centre of the circle on which it lies.

Figure 21:
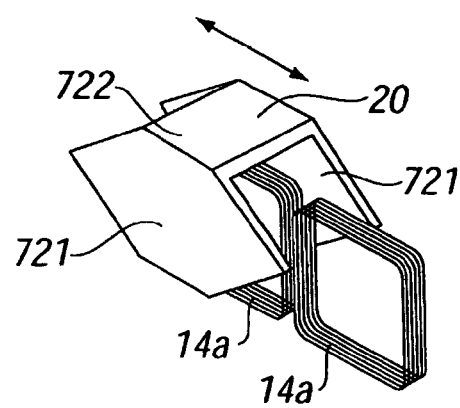

In the construction shown in FIG. 21, the actuator portion is hollow, comprising two generally trapezoidal sides 721 connected above by a bridging portion 722. This is linearly movable to receive, to an increasing or decreasing extent, two coils arranged as in FIGS. 19 and 20, the sides 721 being parallel to the coils 14a.

Each of the coils 14a in the arrangements shown in FIGS. 17 to 21 may comprise the composite coil construction shown in FIG. 16.

The portions of a composite actuator portion could be separate.

The actuator portions may be made of steel, aluminium, brass or other electrically-conductive metal alloy or other electrically-conductive material.

The electrically-conductive material of the actuator portion is advantageously magnetically permeable, as is steel for example.

Figure 22:
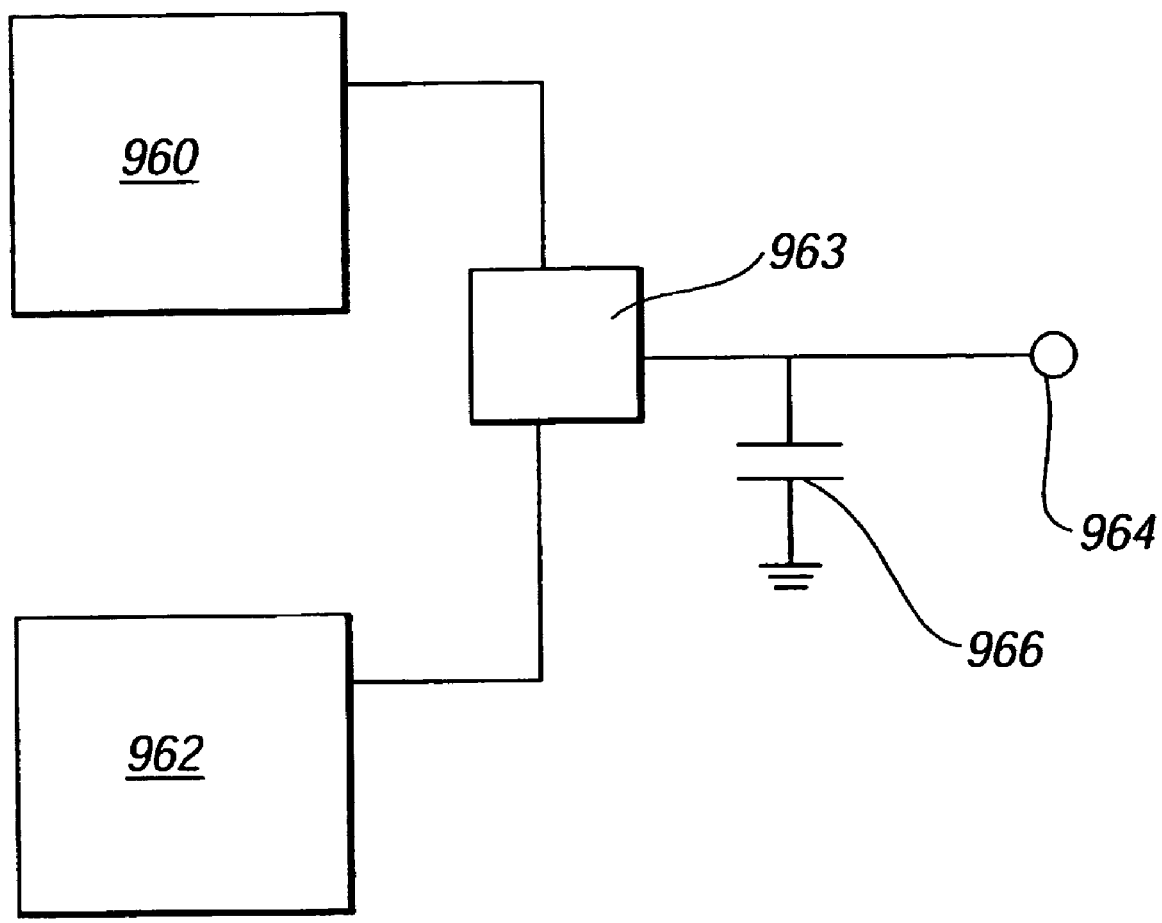
FIGS. 22 to 25 show respective further circuits of respective different position sensors embodying the present invention.

The circuitry to which the coils 14a or 228 of the position sensors shown in FIGS. 10a to 10e, 13a to 13e, 13f, and 14 to 21 is shown diagrammatically in FIG. 22. It comprises two circuits 960 and 962, each being the same as the circuit shown in FIG. 6 or FIG. 8, these two circuits being connected to the two coils, or two of the coils, of the position sensor respectively. The outputs of the circuits 960 and 962 are connected to respective inputs of an operator circuit 963. If the outputs from the circuits 960 and 962 have the values A and B respectively, the operator circuit is such as to provide at its output 964 a signal having the value (A−B)/(A+B). The latter output may be smoothed by a capacitor 986.

When the apparatus is in use, the circuitry shown in FIG. 22 operates for each coil with the pulses being transmitted to the two coils asynchronously so that when one is energized, the other is not, and vice versa, and such that there is a delay period between each pulse when neither winding is energized to avoid a measurement by one of the windings interfering with that of the other.

Figure 23:
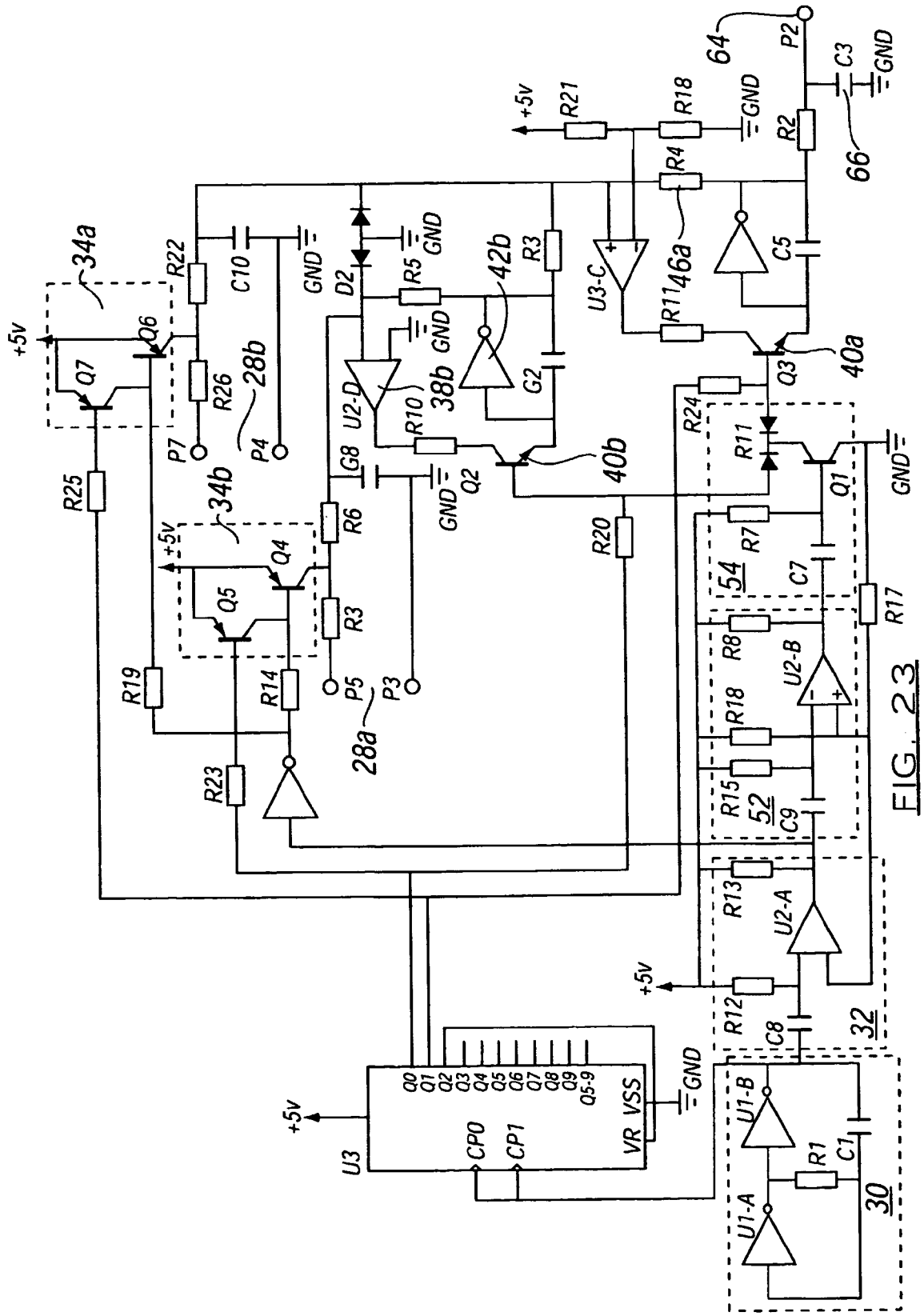

FIG. 23 shows the circuitry of FIG. 22 in greater detail, with corresponding parts of the circuitry in the FIGS. 6 and 23 bearing the same reference numerals, save that where a part of the circuitry in FIG. 23 relates to one of the coils, it has the suffix a, and where a part of the circuitry in FIG. 23 relates to the other coil, it has the suffix b.

Figure 24:
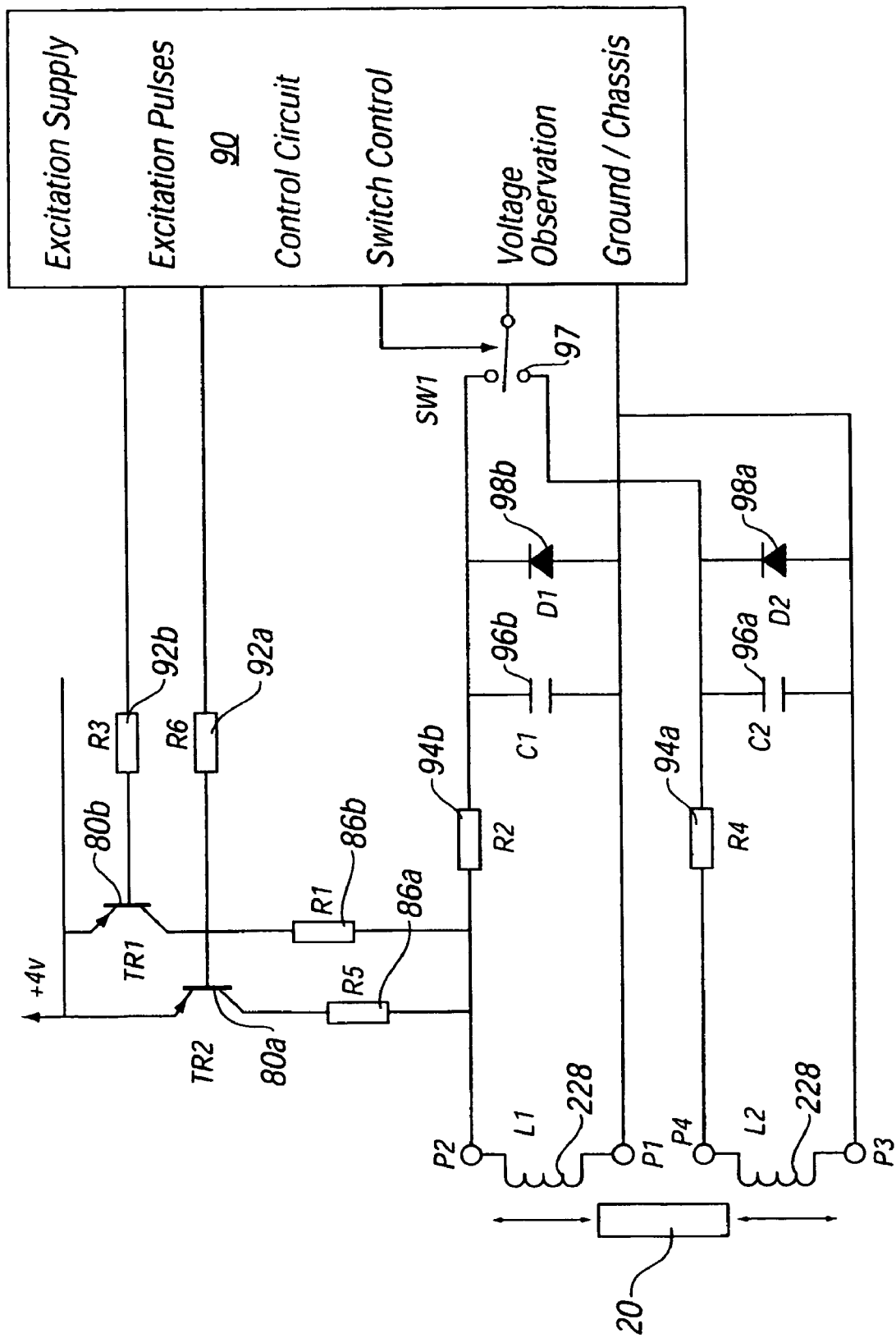

The circuitry in FIG. 24 comprises the circuitry of FIG. 8, adapted for two coils. The function of the operator circuit of FIG. 22 is performed by the circuitry within the control circuit 90. Use of the reference numerals of FIG. 24 corresponds to that for FIG. 8, save that the suffices a and b are used for those parts of-the circuitry of FIG. 24 relating to the two coils respectively. A switch 97 is provided to enable observation of the voltages across both capacitors 96a and 96b by the control circuit 90.

Figure 25:
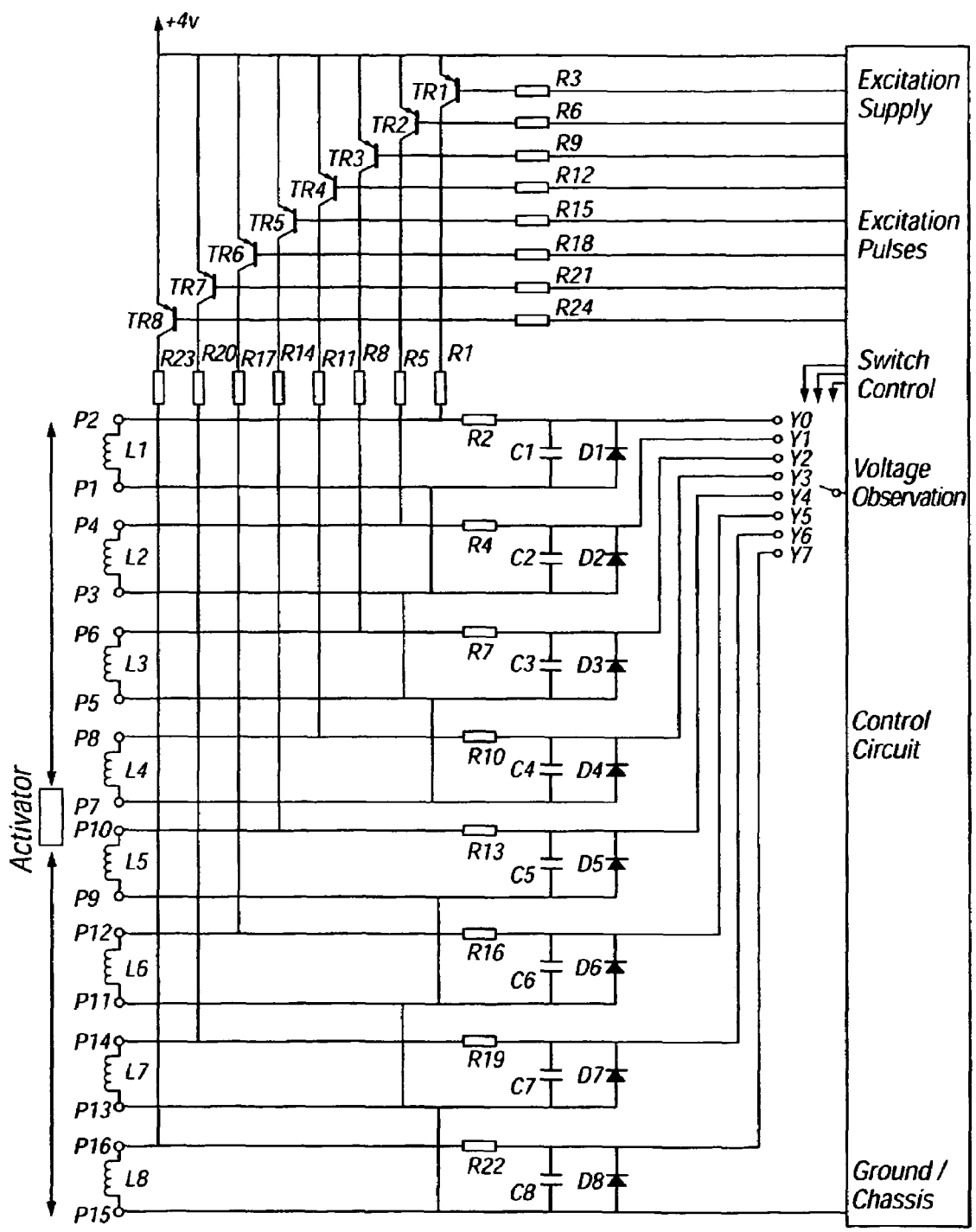

The circuitry shown in FIG. 25 corresponds to that of FIG. 24, but for a multiplicity of coils. The control circuit here is provided with means (not shown) for determining which of the two coils are providing the highest output, and for obtaining the value (A−B)/(A+B) from the two coils.

Means (not shown) may be provided for all the illustrated embodiments to ascertain a reading given in the absence of the actuator portion 20 or 200, and thereafter to modify the resulting measurement. For example, if there are background measurements for the two or for two of the coils of one of the position sensors a and b respectively, the output value may be adjusted by calculating the value (A−a−B+b)/(A−a+B−b).

The invention claimed is:

1. A micro-switch comprising a movable actuator portion of electrically conductive material attached to support means so as to be movable against resilient means of the micro-switch, wherein the micro-switch further comprises at least one coil of elongate electrically conductive material mounted on the support means, such that the movable actuator portion is movable against the resilient means so as to be adjacent to the coil, and pulse inductive circuitry connected to the said at least one coil, and constructed to switch from one condition to another when the actuator portion is moved against the force of the resilient means beyond a predetermined threshold point as indicated by pulse inductive monitoring effected by the pulse inductive circuitry, wherein said inductive circuitry comprises a pulse generator that delivers a switching pulse to a pulse switch that is connected to apply a voltage to said at least one coil to provide an energizing pulse to said at least one coil such that when the energizing pulse ends. the self-inductance of said at least one coil causes the voltage across it to fall to a negative value of a magnitude well in excess of the voltage it had initially, and wherein the inductive circuitry further comprises measuring means connected across the said at least one coil to measure the inductance voltage there across at a time when the excitation energy has died away, being the inductance voltage owing to the presence of the movable actuator portion.

2. A micro-switch according to claim 1, wherein the pulse inductive circuitry is constructed to switch from the said another condition to the said one condition when the actuator portion is moved with the force of the resilient means beyond a predetermined threshold point as indicated by pulse inductive monitoring effected by the pulse inductive circuitry.

3. A micro-switch according to claim 2, wherein the said predetermined threshold point is the same position as the predetermined threshold point at which the circuitry is changed from the said one condition to the said another condition when the actuator portion is moved against the force of the resilient means.

4. A micro-switch according to claim 1, wherein the pulse inductive circuitry is so constructed as to provide a measurement of the voltage across the coil at respective first and second instants of time after an energizing pulse.

5. A micro-switch according to claim 4, wherein the pulse inductive circuitry is further constructed to check whether the actuator portion is moved beyond the said threshold point with the actuator portion being moved against the force of the resilient means, at the said firs: Instant, and to check whether the actuator portion is moved beyond the threshold point with the actuator portion moving with the force of the resilient means, at the said second instant.

6. A micro-switch according to claim 1, wherein the pulse inductive circuitry is constructed to carry out measurement cycles, each comprising an energizing pulse followed by a measurement, repeated continuously.

7. A micro-switch according to claim 6, wherein the pulse inductive circuitry effects a measurement of the voltage across the coil comprising an average of successive measurements of respective successive measurement cycles.

8. A micro-switch according to claim 7, wherein the period between successive measurement cycles is a first, relatively long, time interval unless and until a movement of the actuated portion is indicated by at least one of the measurement cycles, whereupon the period between successive measurement cycles is reduced.

9. A micro-switch according to claim 7, wherein the pulse inductive circuitry is such that a plurality of successive further values of a measurement for successive cycles is checked by the circuitry to ascertain whether the first indication of movement was false or not, and so tat if it was, the period between successive cycles is immediately returned to the relatively long period, and if it was not, the shorter period between measurement cycles is maintained by the circuitry.

10. A micro-switch according to claim 1, wherein the actuator portion lies on the axis of the said at least one coil.

11. A micro-switch according to claim 1, wherein the actuator portion is movable to enter the coil interior.

12. A micro-switch according to claim 1, wherein the said resilient means comprises a relatively springy arm secured at one of its ends to the support means and providing the actuator portion at its other end.

13. A micro-switch according to claim 12, wherein the arm is substantially at right angles to the axis of the coil.

14. A micro-switch according to claim 12, wherein the arm including the actuator portion comprises an electrically conductive material and the actuator portion is provided beyond a bend in the arm.

15. A micro-switch according to claim 14, wherein the bend effects a turn of the material of the arm of about 90 degrees.

16. A micro-switch according to claim 1, wherein it is so constructed that there is at least one further predetermined threshold point beyond which the actuator portion may be moved against the force of the resilient means to effect a switching of the pulse inductive circuitry to a further condition.

17. A micro-switch according to claim 1, wherein the actuator portion is removable to enable a measurement to be made after an energizing pulse has issued, resulting from the environment of the micro-switch as opposed to the position of the actuator portion, thereby to correct the threshold setting for the environment in which the micro-switch is placed.

18. A micro-switch according to claim 1, wherein the period of each energizing pulse is substantially equal to the actuator portion dine constant.

19. A micro-switch according to claim 4, wherein the circuitry is so constructed is to take a further measurement at a third instant, to check that the coil and the circuitry and the associated components are present and working at a time when the actuator portion is fully withdrawn.

20. A micro-switch according to claim 1, wherein the pulse inductive circuitry is further constructed to check that the voltage which is measured across the coil during a measurement cycle is substantially zero at a time when it would be expected that the signal has reached zero after an energizing pulse.

21. A micro-switch according to claim 1, wherein the pulse inductive circuitry is constructed to issue diagnostic energizing pulses in addition to the measurement energizing pulses to confirm that the circuitry is present and correct.

22. A micro-switch according to claim 1, wherein the pulse inductive circuitry creates an energizing pulse to be effected by the switching of a field effect transistor of the circuitry.

23. Control apparatus incorporating a micro-switch as claimed in claim 1.

* * * * *